(12) United States Patent
Chien et al.

(10) Patent No.: US 6,465,364 B2
(45) Date of Patent: Oct. 15, 2002

(54) METHOD FOR FABRICATION OF A CONTACT PLUG IN AN EMBEDDED MEMORY

(75) Inventors: Sun-Chieh Chien; Chien-Li Kuo, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/764,328

(22) Filed: Jan. 19, 2001

(65) Prior Publication Data

US 2002/0098704 A1 Jul. 25, 2002

(51) Int. Cl.$^7$ .............................. H01L 21/00
(52) U.S. Cl. .............. 438/719; 438/723; 438/724; 438/740; 438/720; 438/721; 438/743
(58) Field of Search .................. 438/694, 692, 438/697, 719, 723, 720, 721, 724, 740, 743, 742, 744, 745, 754, 755, 756, 757; 216/2, 38, 88, 79, 91, 99

(56) References Cited

U.S. PATENT DOCUMENTS 6,194,320 B1 * 2/2001 Oi ....................... 438/757 X
6,200,905 B1 * 3/2001 Pan ...................... 438/720 X
6,335,285 B1 * 1/2002 Chun et al. ............. 438/724 X

* cited by examiner

Primary Examiner—William A. Powell
(74) Attorney, Agent, or Firm—Winston Hsu

(57) ABSTRACT

The present invention provides a method for the formation of contact plugs of an embedded memory. The method first forms a plurality of MOS transistors on a defined memory array region and periphery circuit region of the semiconductor wafer. Then, a first dielectric layer is formed on the memory array region, and plurality of landing pads is formed in the first dielectric layer. Next, both a stop layer and a second dielectric layer are formed, respectively, on the surface of semiconductor wafer. A PEP process is then used to form a plurality of contact plug holes in the second dielectric layer in both the memory array region and the periphery circuit region. Finally, a conductive layer is filled into each hole to form in-situ each contact plug in both the memory array region and the periphery circuit region.

20 Claims, 12 Drawing Sheets

METHOD FOR FABRICATION OF A CONTACT PLUG IN AN EMBEDDED MEMORY

FIELD OF THE INVENTION

The present invention provides a method for fabrication of a contact plug in an embedded memory.

DESCRIPTION OF THE PRIOR ART

In order to avoid shortcircuiting of devices in an embedded memory, an insulation layer is positioned between each device and circuit. A photo-etching-process (PEP) is then used to form a plurality of contact holes in the insulation layer. A conductive layer fills each contact hole to electrically connect each metal-oxide-semiconductor (MOS) wafer and the circuit.

Please refer to FIG. 1 to FIG. 8. FIG. 1 to FIG. 8 are schematic diagrams of a method of fabricating a landing via and a strip contact in an embedded memory according to the prior art. As shown in FIG. 1, defined on the surface of a silicon substrate 16 of a semiconductor wafer 10 is a memory array region 12 and a periphery circuit region 14. The memory array region 12 comprises at least a cell-well 18, and the periphery circuit region 14 comprises at least an N-well 20 and a P-well 22. In the prior art, a plurality of gates 24, 26, 28 are first formed, separately, in the memory array region 12 and in the periphery circuit region 14. A spacer 30 and a lightly doped drain (LDD) 32 are formed adjacent to each gate 24, 26, 28. As well, a source 34 and a drain 36 are also formed adjacent the gates 26, 28.

As shown in FIG. 2, a dielectric layer 38, such as a silicon oxide layer, is then formed on the surface of the semiconductor wafer 10. A photolithographic process is used to define a pattern of several shallow metal connection regions 40 on the surface of the dielectric layer 38, as shown in FIG. 3. Next, another photolithographic process is performed to define a first contact window 44, a second contact window 42, and a third contact window 46 in the dielectric layer 38, as shown in FIG. 4. The first contact window 44 is used to connect to a capacitor, the second contact window 42 subsequently forms a landing via and connects to a bit line, and the third contact window 46 subsequently forms a strip contact and connects to a source or drain in the periphery circuit region 14. The depths of the first contact window 44, the second contact window 42 and the third contact window 46 are all equal, and thus the three contact windows are horizontally aligned.

As shown in FIG. 5, a photolithographic process is then used to form a fourth contact window 48 in the dielectric layer 38. The fourth contact window 48 is used to connect to a gate in the strip contact of the periphery circuit region 14. Since the depth of the fourth contact window 48 is shallower than that of the other contact windows, its horizontal alignment differs to that of the first contact window 44, the second contact window 42 and the third contact window 46. The third contact window 46 and the fourth contact window 48 are separately connected to the gate and source or drain of different transistors, and therefore the two contact windows are located on different vertical planes. As shown in FIG. 6, a barrier layer 50 of titanium nitride and a dielectric layer 52 of tantalum oxide are formed, respectively, on the substrate 16.

As shown in FIG. 7, a photoresist layer (not shown) is used as a mask to etch the dielectric layer 52 so that the dielectric layer 52 remains only in the second contact window 42 and its metal connection region 40. As shown in FIG. 8, a metal layer 54 is deposited on the surface of substrate 16 and fills into each contact window 42, 44, 46, 48 and each metal connection region 40. Finally, the dielectric layer 38 is used as an etching stop layer for chemical mechanical polishing (CMP) of the metal layer 54.

However, in the disclosure of the prior art method for fabricating a landing via and a strip contact of an embedded memory, the landing via and strip contact are fabricated separately due to the large depth difference between the memory array region and the periphery circuit region. Thus, at least four photomasks are needed in the prior art process, leading to a costly and complicated process. As well, the sites used to connect the gate and to connect the source or drain in the strip contact of the periphery circuit region are formed separately, leading to a larger occupation of space of the unit memory.

SUMMARY OF THE INVENTION

It is therefore a primary objective of the present invention to provide a fabrication method for a contact plug of an embedded memory, to simplify the complexity and to decrease the cost of the process.

The present method involves first forming a plurality of MOS transistors on a defined memory array region and periphery circuit region of the semiconductor wafer. Then, a first dielectric layer is formed on the memory array region and a plurality of landing pads are also formed in the first dielectric layer. Next, a stop layer and a second dielectric layer are formed on the surface of the semiconductor wafer, and a PEP process is performed to form a plurality of contact plug holes in the second dielectric layer in both the memory array region and the periphery circuit region. Finally, a conductive layer is filled into each hole to simultaneously form each contact plug in both the memory array region and the periphery circuit region.

The present invention method for fabricating contact plugs of an embedded memory require only two photomasks in the process. Moreover, each contact plug and metal interconnection layer of an embedded memory are completed in a single PEP process, thus, simplifying the complexity and decreasing the cost of the process.

These and other objectives of the present invention will no doubt, become obvious to those of ordinary skill in the art after reading the following detailed description of the preferred embodiment, which is illustrated in the various figures and drawings.

DESCRIPTION OF THE PREFERRED EMBODIMENT

Figure 1:
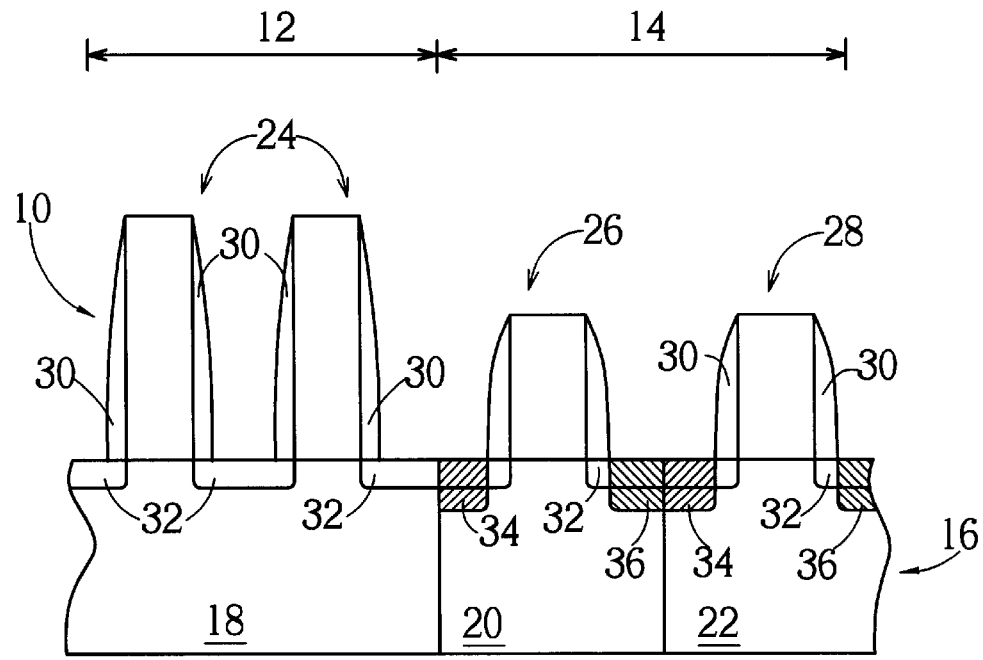
FIG. 1 to FIG. 8 are schematic diagrams of the fabrication of contact plugs of an embedded memory according to the prior art.
Figure 2:
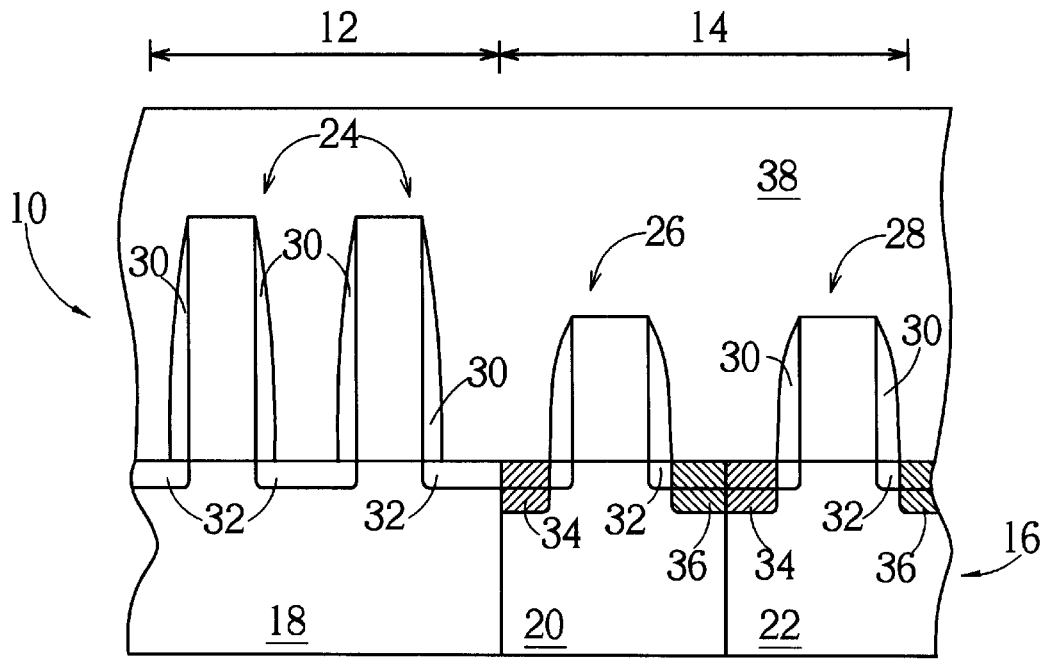
Figure 3:
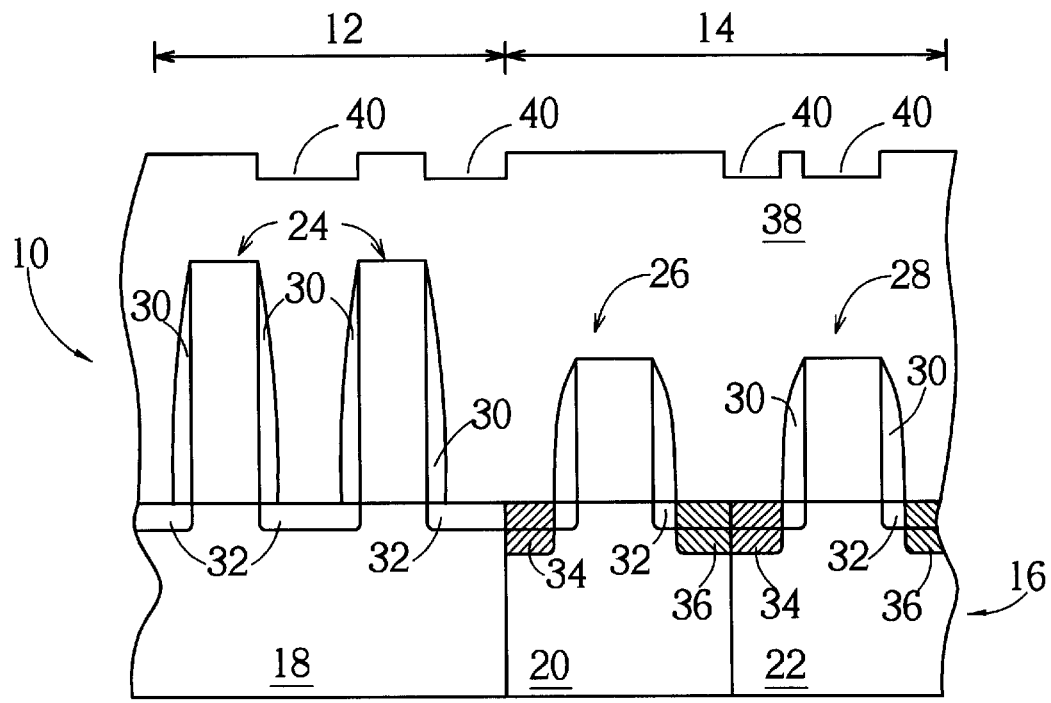
Figure 4:
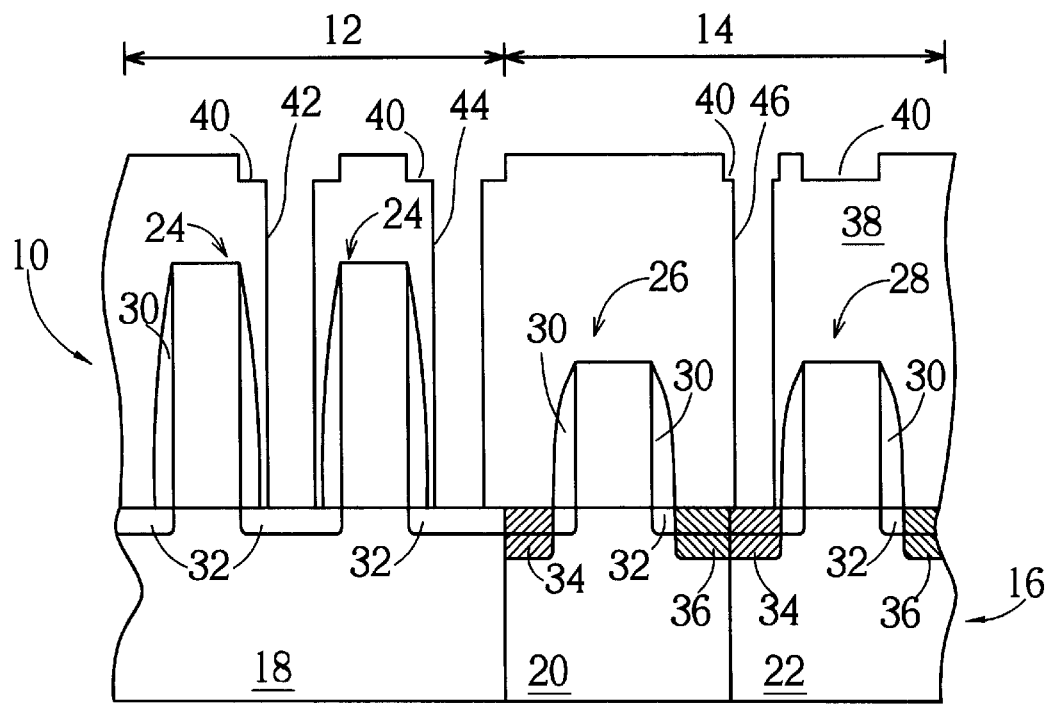
Figure 5:
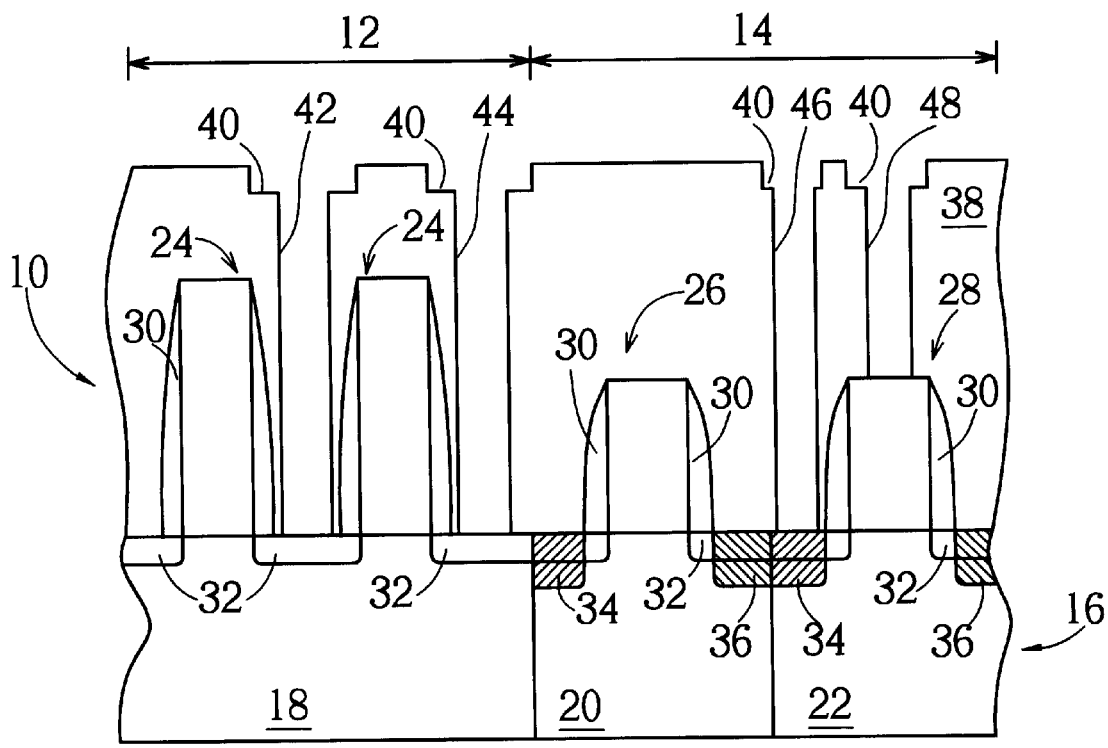
Figure 6:
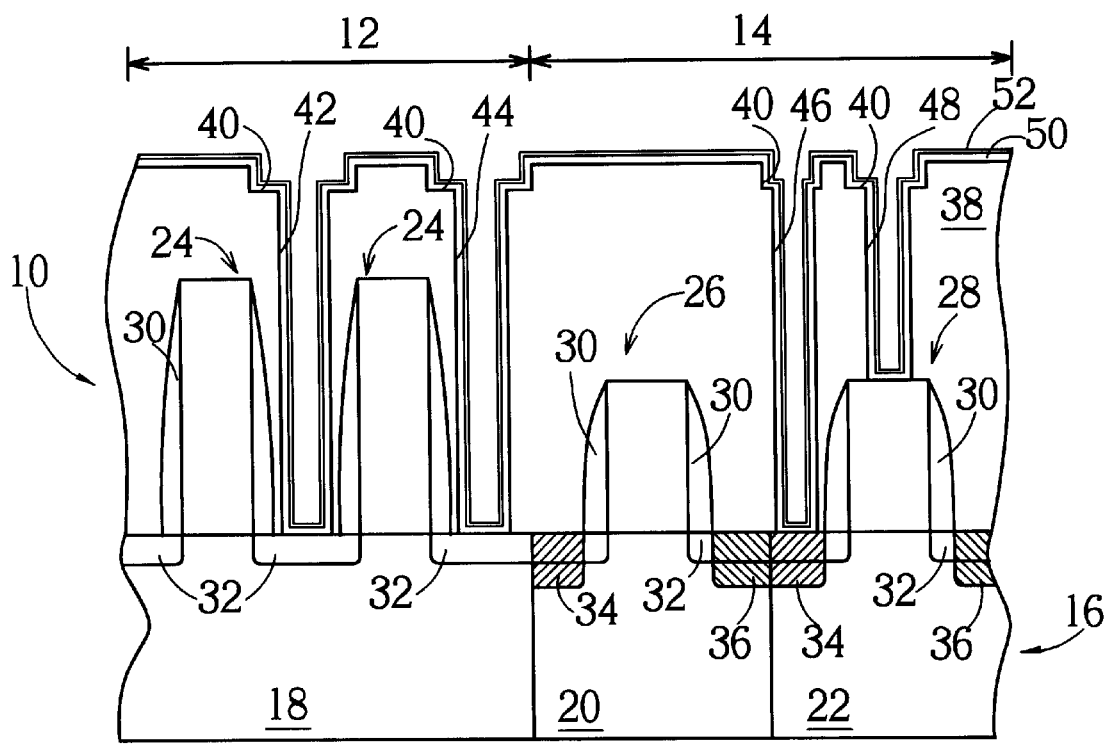
Figure 7:
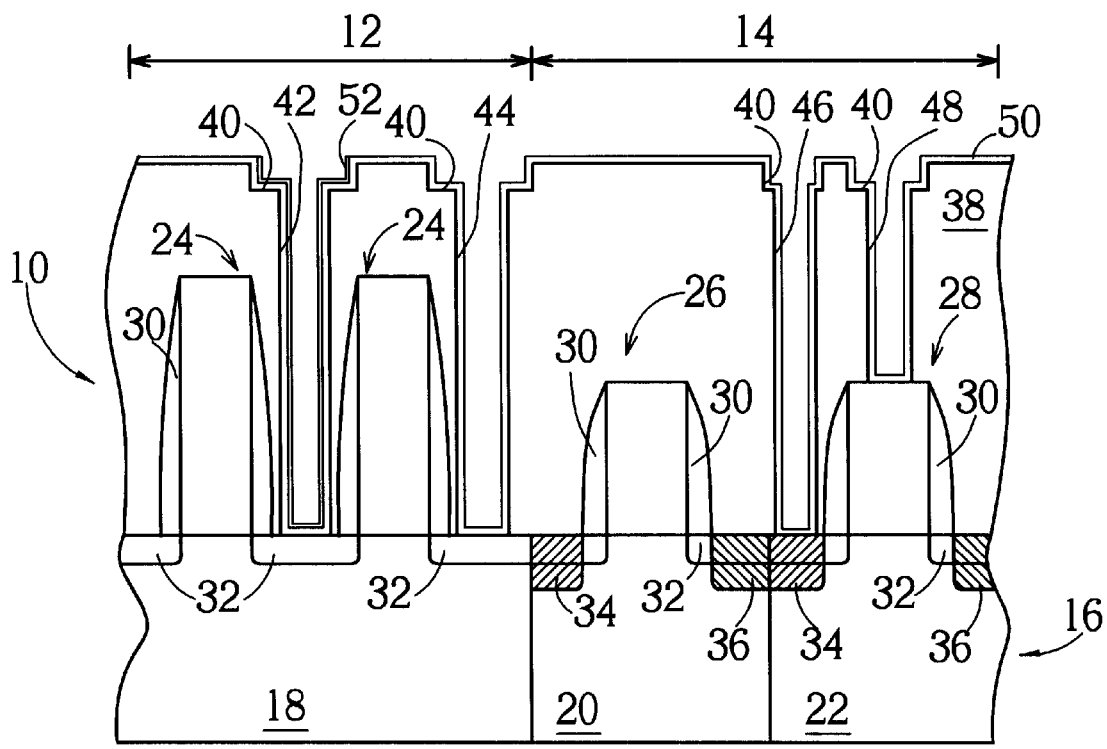
Figure 8:
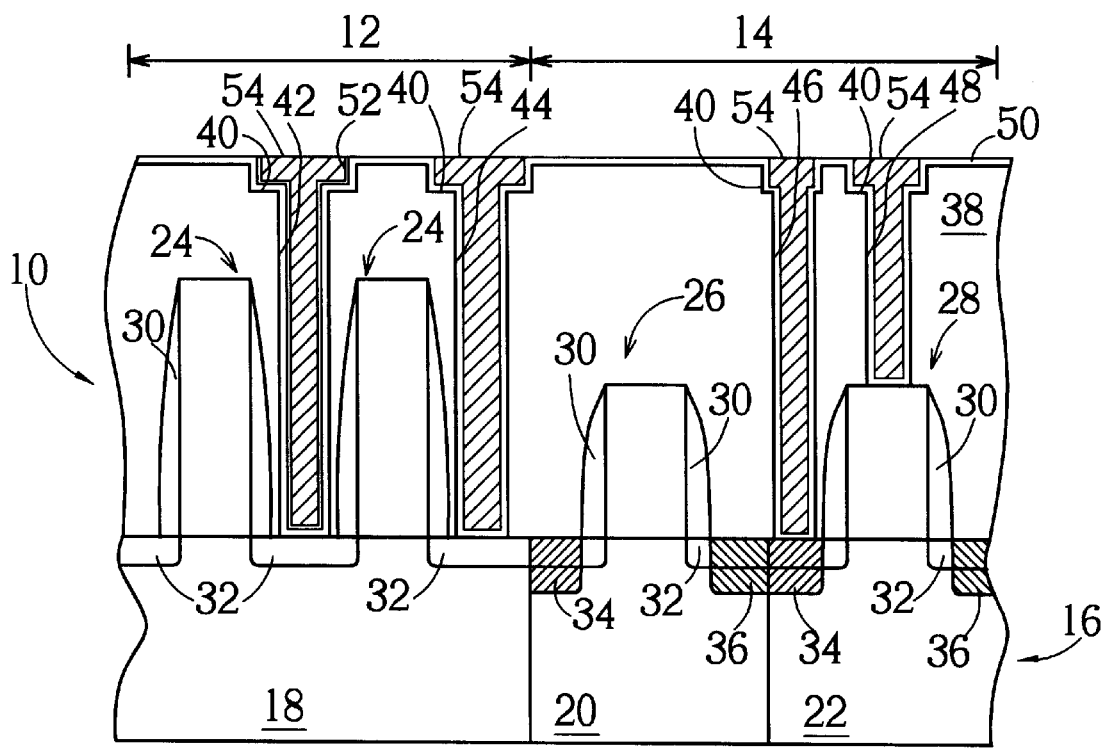
Figure 9:
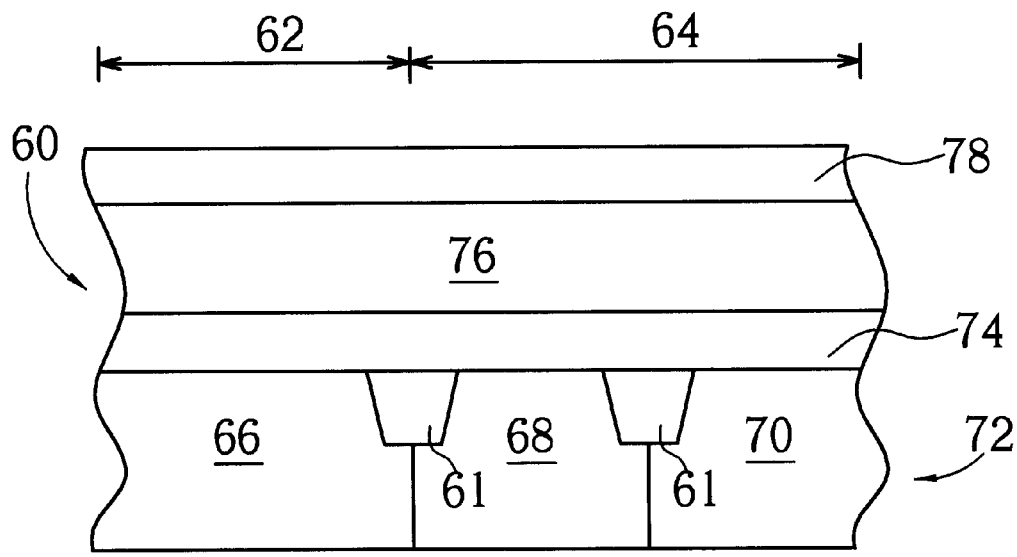
FIG. 9 to FIG. 24 are schematic diagrams of the fabrication of contact plugs of an embedded memory according to the present invention.

Please refer to FIG. 9 to FIG. 24. FIG. 9 to FIG. 24 are schematic diagrams of the fabrication of contact plugs of an embedded memory on a semiconductor wafer 60 according to the present invention. As shown in FIG. 9, a semiconductor wafer 60 has both a memory array region 62 and a periphery circuit region 64 defined on the surface of a silicon substrate 72. The memory array region 62 comprises at least a cell-well 66, and the periphery circuit region 64 comprises at least a N-well 68 and at least a P-well 70. Several shallow trench isolation (STI) structures 61 are formed to separate each region.

Figure 10:
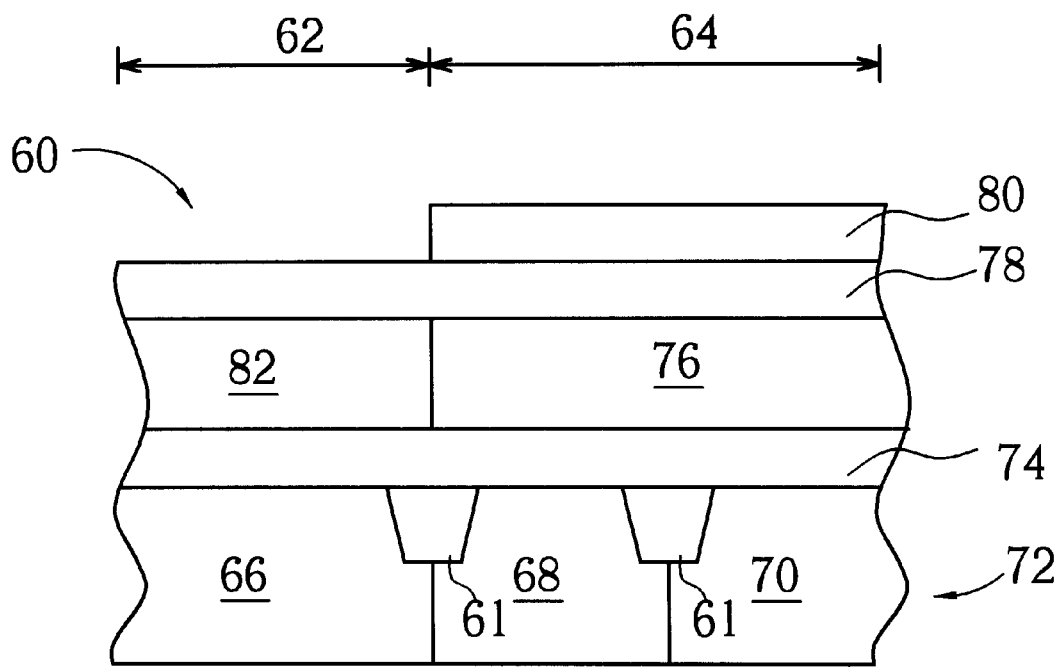

The present invention involves first forming a first dielectric layer 74, an undoped polysilicon layer 76, and a dielectric layer 78, respectively, on the surface of the semiconductor wafer 60. Then, as shown in FIG. 10, a mask layer 80 is formed on the dielectric layer 78 in the periphery circuit region 64. A N-type ion implantation process is performed on the undoped polysilicon layer 76 in the memory array region 62, whereby the undoped polysilicon layer 76 subsequently becomes a N-type doped polysilicon layer 82.

Figure 11:
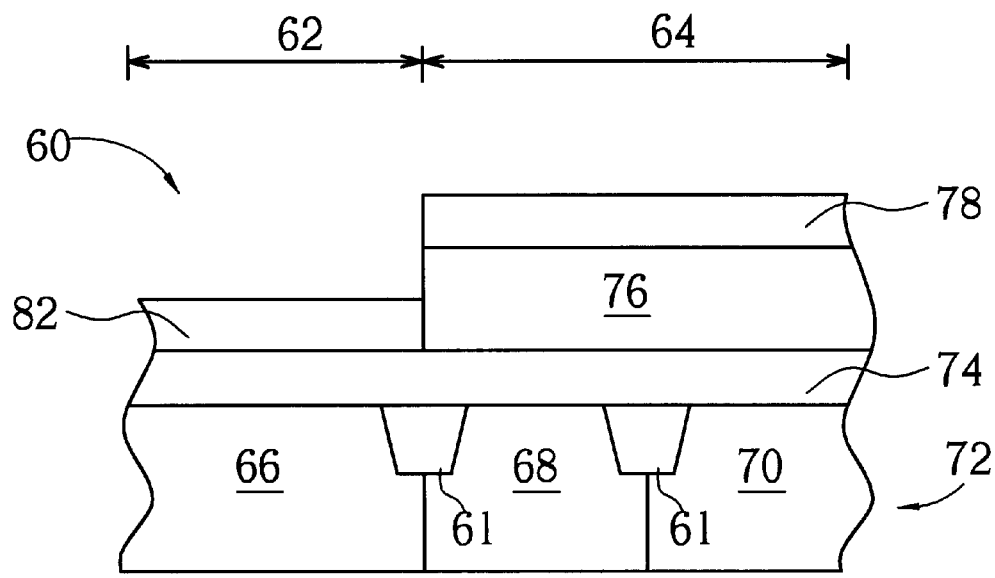
Figure 12:
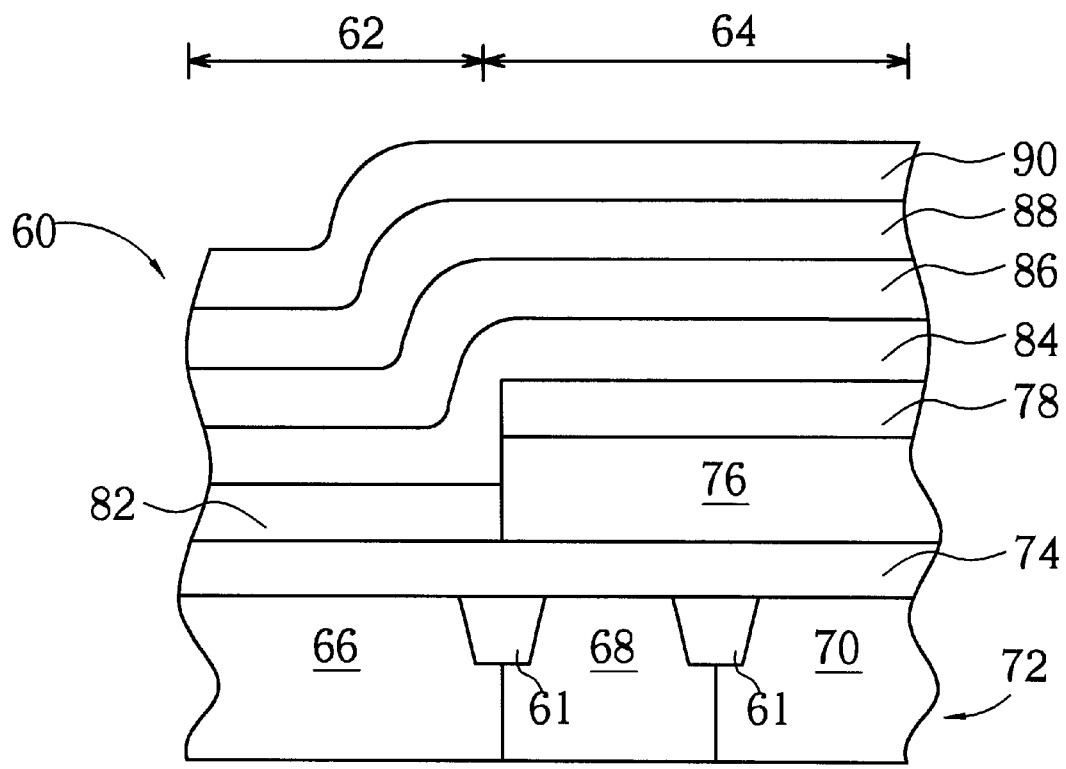

Thereafter, as shown in FIG. 11, an etching process is performed to completely remove the dielectric layer 78 in the memory array region 62, as well as to etch the doped polysilicon layer 82 down to approximately half the total depth of the undoped polysilicon layer 76, or about 1000~1900 Å. As shown in FIG. 12, after removing the mask layer 80 in the periphery circuit region 64, a silicide layer 84, a silicon-oxy-nitride ($SiO_xN_y$) layer 86, a silicon nitride layer 88, and a photoresist layer 90 are formed, respectively, on the surface of the semiconductor wafer 60. The silicide layer 84 functions to reduce the contact interface resistance of the doped polysilicon layer 82, the silicon-oxy-nitride ($SiO_xNy$) layer 84 is an anti-reflection coating (ARC) layer, and the silicon nitride layer 88 serves as a protection layer.

Figure 13:
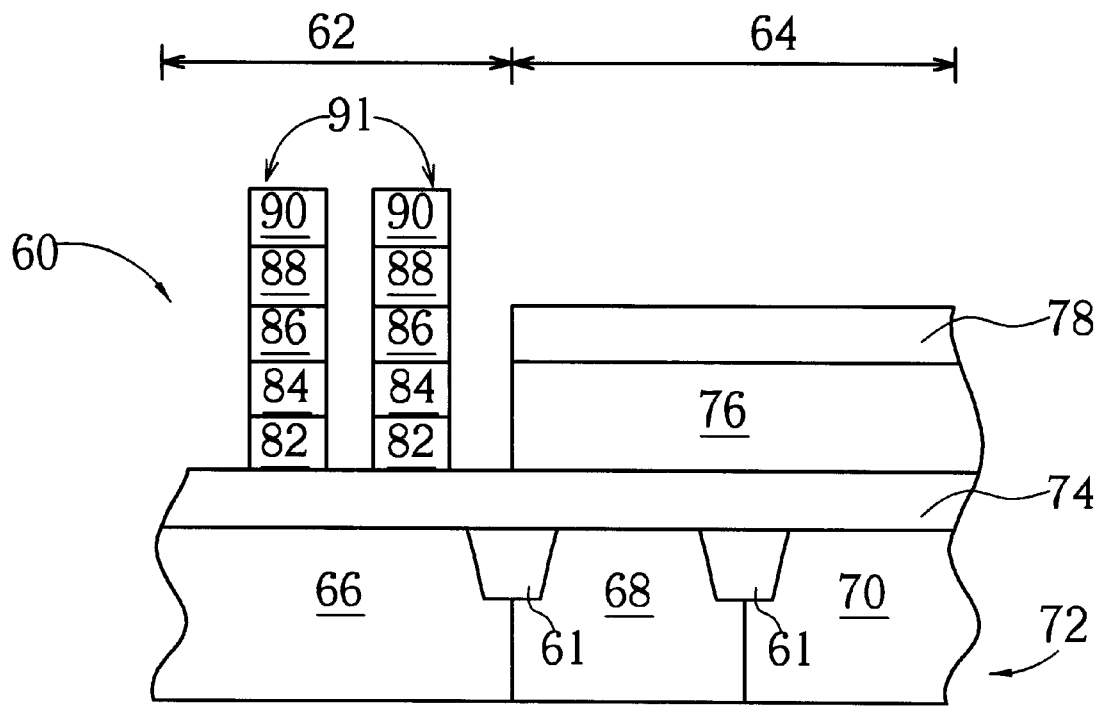

Next, a photolithographic process is performed so as to define a pattern of plurality of gates 91 in the photoresist layer 90 above the cell-well 66 of the memory array region 62. As shown in FIG. 13, the pattern of the photoresist layer 90 is used as a hardmask to etch the silicon nitride layer 88, the silicon-oxy-nitride layer 86, the silicide layer 84, and the doped polysilicon layer 82 positioned in the memory array area 62 down to the surface of the dielectric layer 74. Thus, a plurality of MOS transistor gates 91 are formed in the memory array area 62. An in-situ etching of the silicon nitride layer 88, the silicon-oxy-nitride layer 86 and the silicide layer 84 in the periphery circuit region 64 is then performed down to the surface of the dielectric layer 78.

Figure 14:
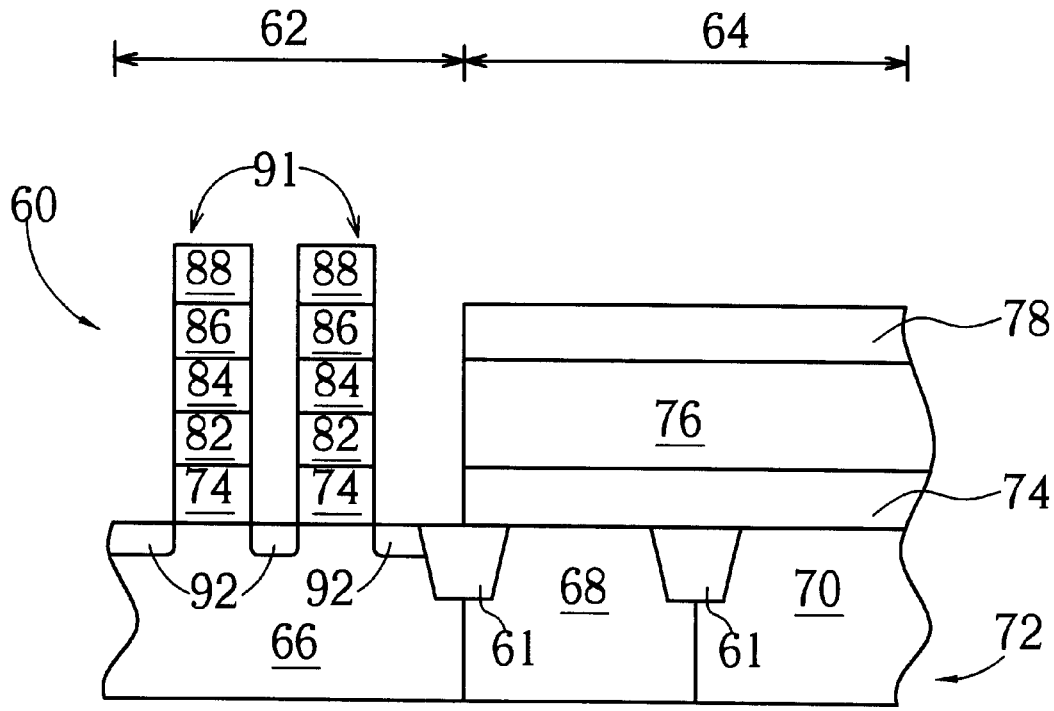
Figure 15:
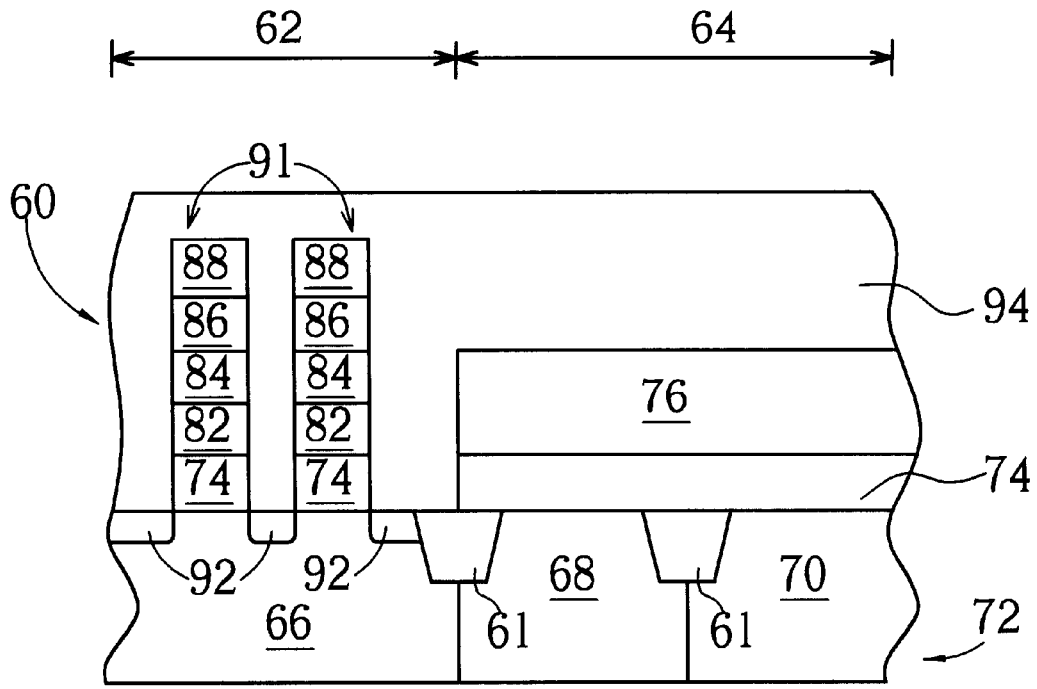
Figure 16:
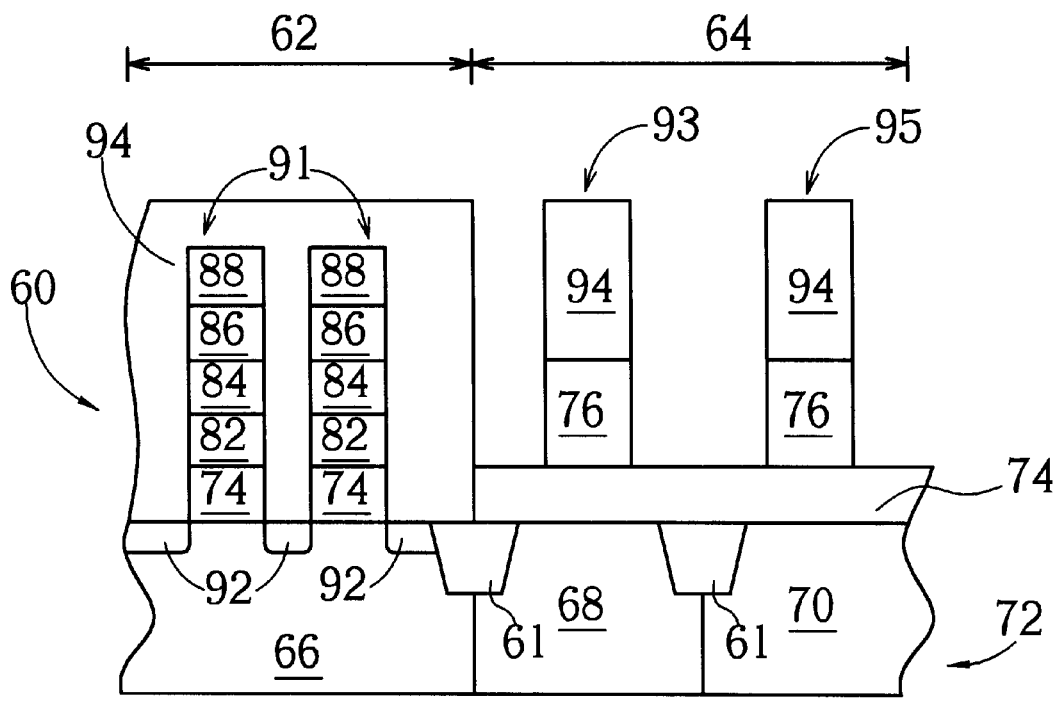

Then, as shown in FIG. 14, an ion implantation process is performed to form lightly doped drains (LDD) 92 for each MOS transistor in the memory array region 62, followed by the removal of the photoresist layer 90. As shown in FIG. 15, after removing the photoresist layer 90, the dielectric layer 78 in the periphery circuit region 64 is also removed. A photoresist layer 94 and a silicon-oxy-nitride layer (not shown) are formed on the surface of the semiconductor wafer 60. The silicon-oxy-nitride layer serves as an anti-reflection coating (ARC) layer. As shown in FIG. 16, a photolithographic process is then performed to define a pattern of a plurality of gates in the photoresist layer 94 above the P-well 70 and the N-well 68 of the periphery circuit region 64. Next, the pattern of the photoresist layer 94 is used as a hardmask to etch the undoped polysilicon layer 76 in the periphery circuit region 64 down to the surface of the dielectric layer 74 so as to form gates 93, 95 for each MOS transistor in the periphery circuit region 64.

Figure 17:
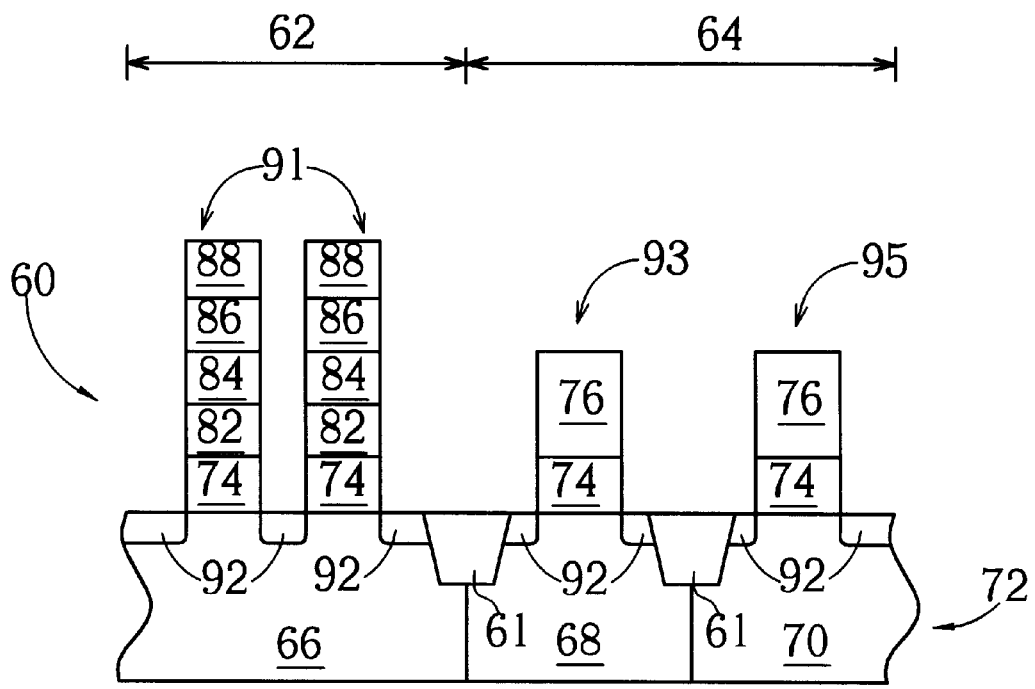
Figure 18:
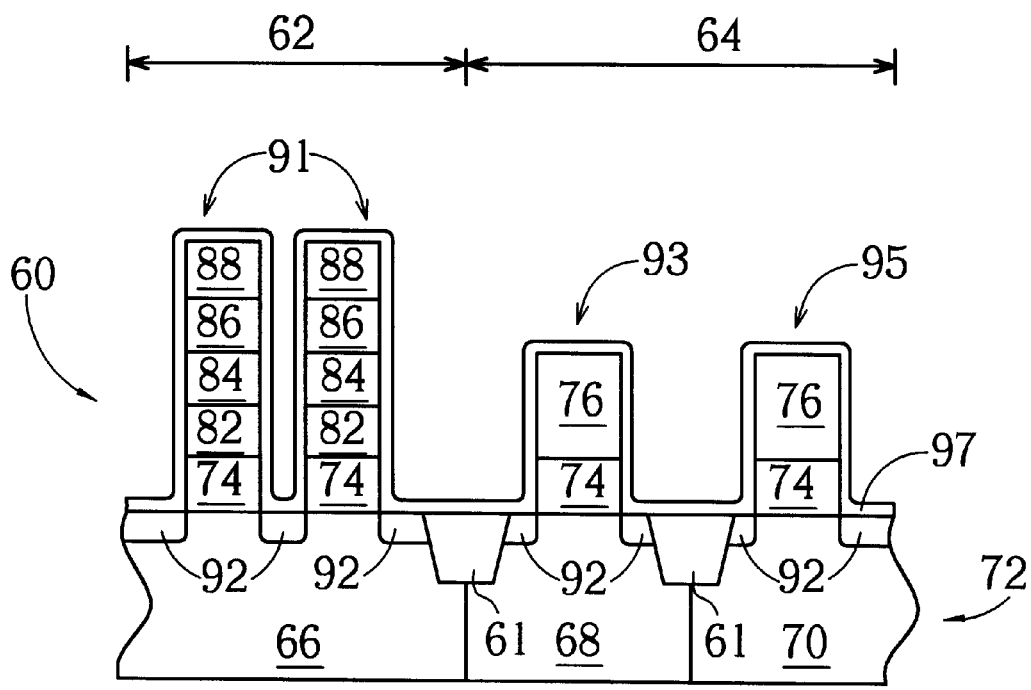
Figure 19:
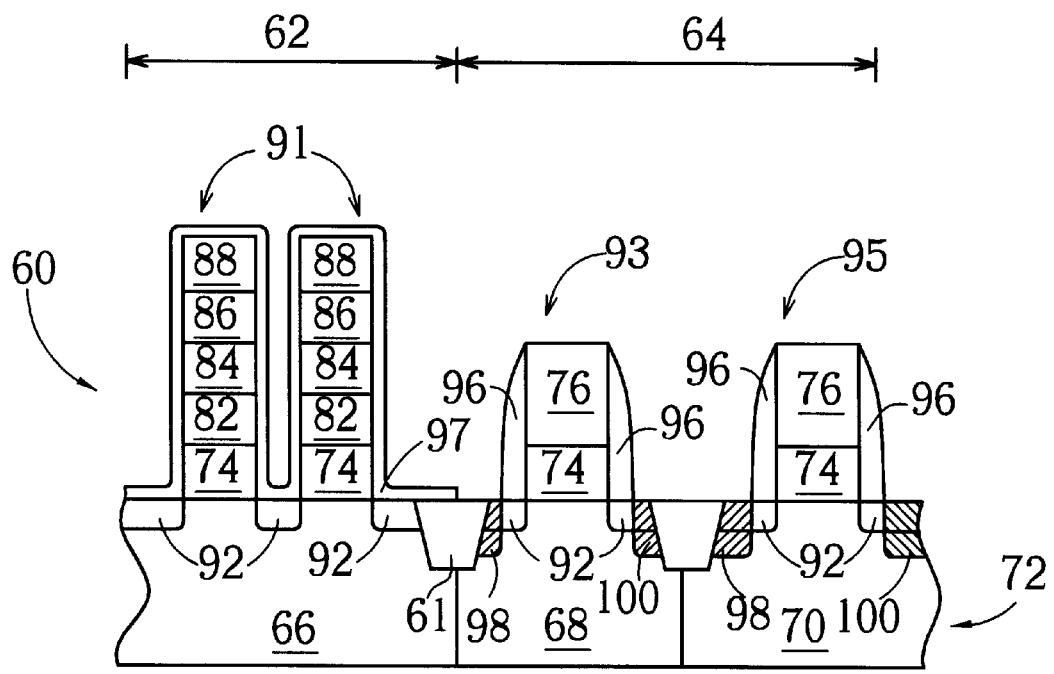

As shown in FIG. 17, an ion implantation process is performed to form lightly doped drains (LDD) 92 for each MOS transistor in the periphery circuit region 64. After removing the photoresist layer 94, a silicon nitride layer 97 is formed on the surface of the semiconductor wafer 60 to cover the surfaces of each gate 91, 93 and 95, as shown in FIG. 18. Then, as shown in FIG. 19, a photoresist layer (not shown) and a photolithographic process are used to define the mask pattern. The mask pattern is used to etch portions of the silicon nitride layer 97 around each gate 93, 95 in the periphery circuit region 64 so as to form spacers 96. Next, an ion implantation process is performed to form sources 98 and drains 100 of the MOS transistor in the periphery circuit region 64.

Figure 20:
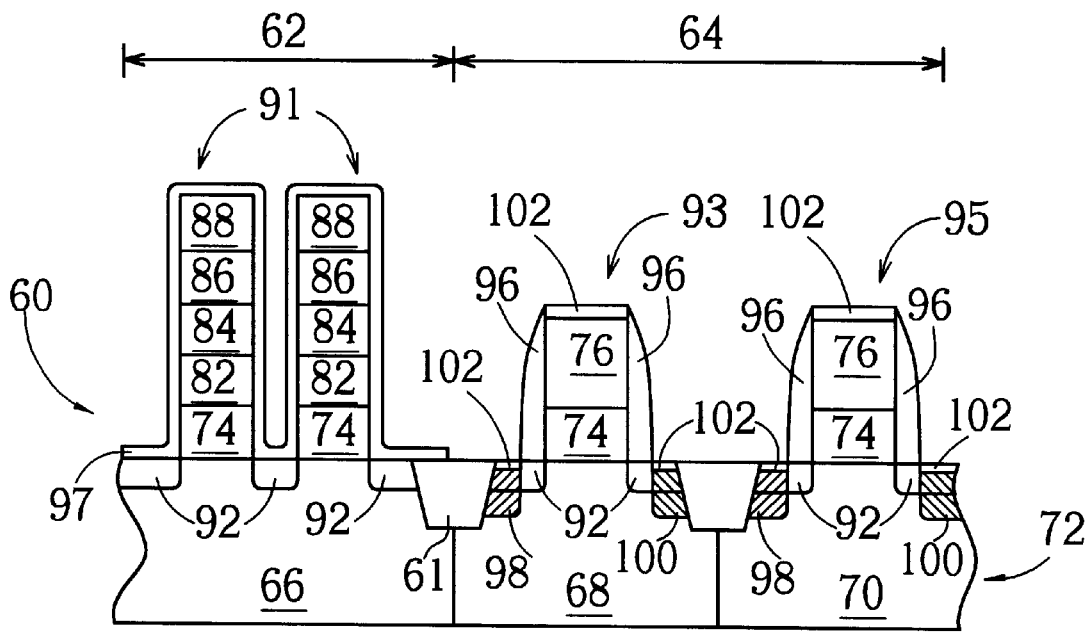

After the formation of the sources 98 and the drains 100 of each MOS transistor in the periphery circuit region 64, a metal layer (not shown), made of Co, is formed on the surface of the semiconductor wafer 60, as shown in FIG. 20. The metal layer covers the surfaces of the sources 98, the drains 100, and the gates 93, 95 in the periphery circuit region 64. Then, a first rapid thermal process (RTP) is performed at a temperature between 400° C. and 600° C. for a duration of 10 to 50 seconds. As a result, a salicide layer 102 is formed on the surfaces of each source 98, drain 100 and gates 93, 95 in the periphery circuit region 64. Then, a wet etching process is performed to remove the portions of the metal layer that do not react with the surface of the semiconductor wafer 60. Finally, a second rapid thermal process (RTP) is performed at a temperature between 600° C. to 800° C. for a duration of 10 to 50 seconds, leading to a reaction of the $Co_2Si$ and CoS in the salicide layer 102 to form $CoSi_2$, which has a lower resistance. Co can also be replaced by other metals such as Ti, Ni, or Mo to form the metal layer.

Figure 21:
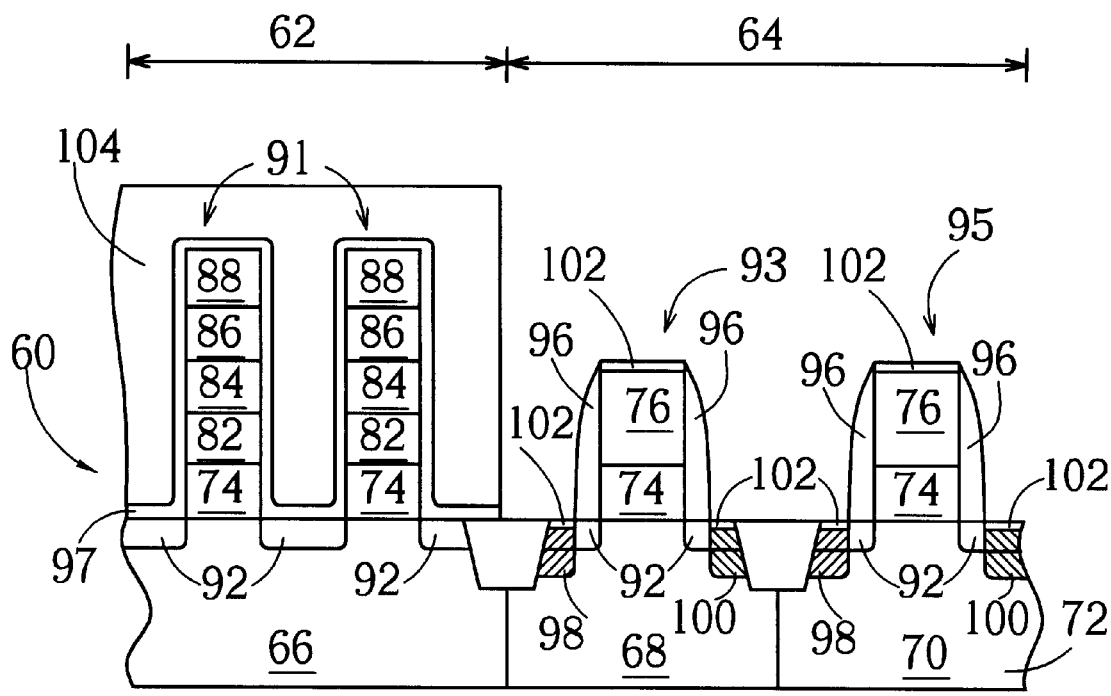
Figure 22:
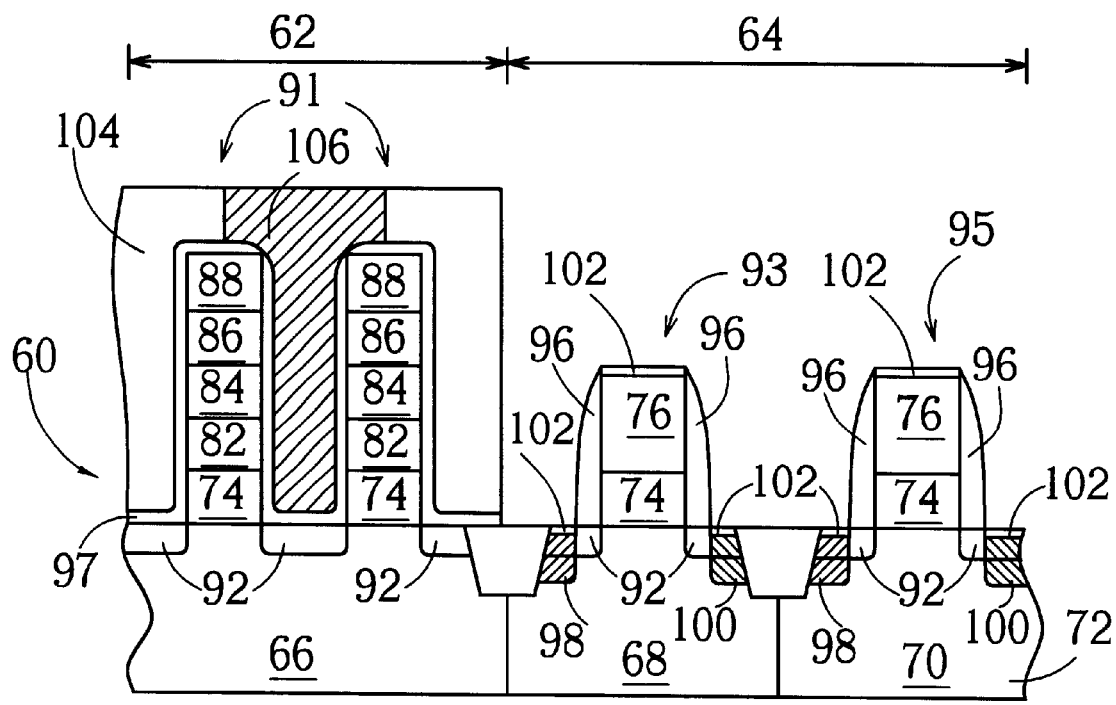
Figure 23:
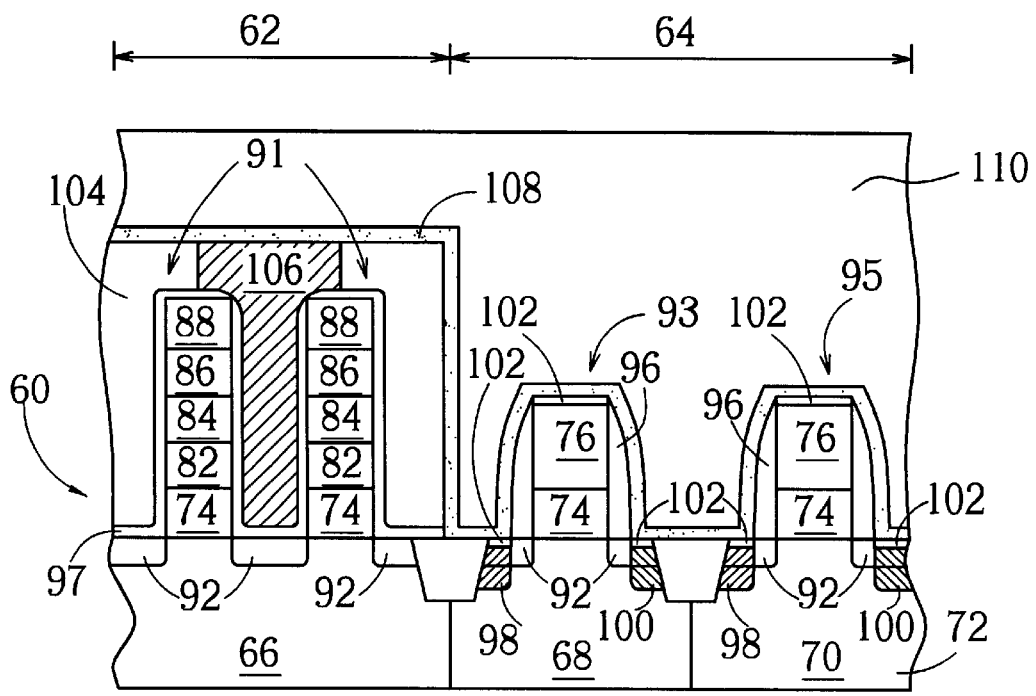

As shown in FIG. 21, after completing each MOS transistor, a dielectric layer 104 is formed in the memory array region 62. A PEP process is then performed to form a plurality of landing pads 106 in the dielectric layer 104, as shown in FIG. 22. As shown in FIG. 23, a stop layer 108 and another dielectric layer 110 are formed, respectively, on the surface of the semiconductor 60, wherein the etching efficiency of the dielectric layer 110 is less than that of the stop layer 108. Following the formation of the dielectric layer 110, a chemical mechanical polishing (CMP)or an etching back process is performed to planarize the dielectric layer 110.

Figure 24:
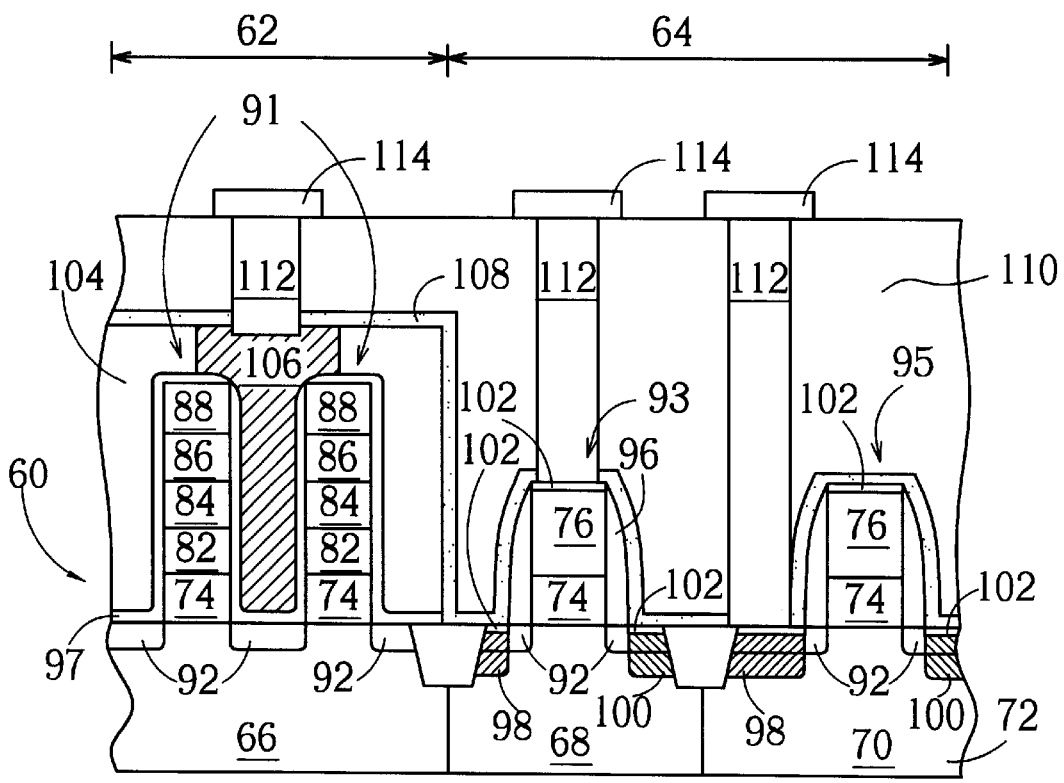

As shown in FIG. 24, aphotoresist layer (not shown) is formed on the surface of the semiconductor wafer 60, and a PEP process is performed to define a pattern of a plurality of contact plugs in both the memory array region 62 and the periphery circuit region 64. Then, the pattern of the photoresist layer is used as a hardmask to etch the dielectric layer 110 down to the surface of the stop layer 108 to form a plurality of contact plug holes in the dielectric layer 110. The stop layer 108 on the bottom surface of each contact plug hole is then removed and a metal conductive layer, composed of a low resistance conductive material such as Cu, fills each contact plug hole. A PEP process is then used to form in-situ each contact plug hole 112 in both the memory array region 62 and periphery circuit region 64. Finally, a metal interconnection layer 114 of an embedded memory is formed above the dielectric layer 110.

The present method for the fabrication of contact plugs of an embedded memory involves first forming connecting pads in the memory array region, and forming in-situ each contact plug and metal interconnection layer of the embedded memory in both the memory array region and periphery circuit region. As a result, the complexity of process is greatly decreased.

In contrast to the prior art method for fabricating contact plugs of an embedded memory, the fabricating method according to the present invention forms in-situ contact plugs in both the memory array region and the periphery circuit region. And also, each contact plug and metal interconnection layer of an embedded memory can be formed in-situ in a single PEP process. Therefore, the number of photomasks used is reduced so as to improve reliability and control as well as to reduce the production cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating contact plugs of an embedded memory, the method comprising:

providing a semiconductor wafer with both a memory array region and a periphery circuit region defined on the surface of the silicon substrate of the semiconductor wafer;

forming separately a plurality of MOS transistors in the memory array region and the periphery circuit region, forming a first dielectric layer in the memory array region;

forming a plurality of landing pads in the dielectric layer in the memory array region;

forming a stop layer on the surface of the semiconductor wafer;

forming a second dielectric layer on the surface of the stop layer;

forming a first photoresist layer on the surface of the semiconductor layer;

performing a first etching process to define a pattern of plurality of contact plugs in the first photoresist layer in both the memory array region and the periphery circuit region;

using the pattern of the first photoresist layer as a hardmask to etch the second dielectric layer down to the surface of the stop layer so as to form a plurality of contact plug holes in the second dielectric layer;

removing the stop layer on the bottom surface of each contact plug hole; and filling each contact plug hole with a conductive layer, so as to form in-situ each contact plug in both the memory array region and the periphery circuit region.

2. The method of claim 1 wherein each MOS transistor is formed in both the memory array region and the periphery circuit region, the method comprises;

forming a third dielectric layer, an undoped polysilicon layer, and a fourth dielectric layer, respectively, on the surface of the semiconductor wafer;

performing a first ion implantation process on the undoped polysilicon layer in the memory array region so as to transform the undoped polysilicon layer in the memory array region to a doped polysilicon layer;

performing a second etching process to completely remove the fourth dielectric layer in the memory array region and to etch a portion of the doped polysilicon layer:

forming a silicide layer, a protection layer, and a second photoresist layer, respectively, on the surface of the semiconductor wafer;

performing a second photolithographic process so as to define a pattern of a plurality of gates in the second photoresist layer in the memory array region;

using the pattern of the second photoresist layer as a hardmask to etch the protection layer, the silicide layer, and the doped polysilicon layer located in the memory array region down to the surface of the third dielectric layer, as well as in-situ etching of both the protection layer and the silicide layer located in the periphery circuit region down to the surface of the fourth dielectric layer;

performing a second ion implantation process to form a lightly doped drain (LDD) adjacent to each gate in the memory array region;

removing both the second photoresist layer and the fourth dielectric layer in the periphery circuit region;

forming a third photoresist layer on the surface of the semiconductor wafer;

performing a third photolithographic process to define a pattern of a plurality of gates in the third photoresist layer in the periphery circuit region;

using the pattern of the third photoresist layer as a hard mask to etch the undoped polysilicon layer in the periphery circuit region down to the surface of the third dielectric layer so as to form each qate in the periphery circuit region;

performing a third ion implantation process to form a lightly doped drain (LDD) adjacent to each gate in the periphery circuit region;

removing the third photoresist layer;

forming a silicon nitride layer on the surface of semiconductor wafer;

etching the silicon nitride layer in the periphery circuit region so as to form a spacer adjacent to each gate in the periphery region;

performing a fourth ion implantation process to form a source and drain adjacent to each gate on the periphery circuit region.

3. The method of claim 2 wherein the second dielectric layer is composed of silicon dioxide ($SiO_2$) and serves as the gate oxide layer for each gate.

4. The method of claim 2 wherein the portion of the undoped polysilicon layer etched by the second etching process is approximately half the total depth of the undoped polysilicon layer.

5. The method of claim 2 wherein the protection layer is composed of silicon nitride, and a silicon-oxy-nitride $SiO_xN_y$, where $0<x<2$ and $0<y<4/3$) layer serving as an anti-reflection coating (ARC) layer is positioned between the protection layer and the silicide layer.

6. The method of claim 2 wherein a silicon-oxy-nitride ($SiO_xN_y$, where $0<x<2$ and $0<y<4/3$) layer, serving as an anti-reflection coating (ARC) layer, is formed on the surface of the semiconductor wafer prior to the formation of the third photoresist layer on the surface of the semiconductor wafer.

7. The method of claim 6 wherein after the third photoresist layer is removed, the silicon-oxy-nitride ($SiO_xN_y$, where $0<x<2$ and $0<y<4/3$) layer located underneath the third photoresist layer is also removed.

8. The method of claim 2 wherein after the formation of the source and the drain of each MOS transistor in the periphery circuit region, the method also comprises:
   forming a metal layer on the surface of the semiconductor wafer, the metal layer covering the surfaces of each source, drain, and gate in the periphery circuit region;
   performing a first rapid thermal process (RTP);
   removing the portions of the metal layer that do not react with the surface of the semiconductor wafer; and
   performing a second rapid thermal process (RTP).

9. The method of claim 8 wherein the metal layer is composed of cobalt (Co), titanium(Ti), nickel (Ni), or molybdenum (Mo).

10. The method of claim 1 wherein each contact plug and the first metal interconnection layer of an embedded memory is completed in-situ in the same single photo-etching-process, and the conductive layer is a metal layer.

11. A method for fabricating contact plugs of an embedded memory, the method comprising:
   providing a semiconductor wafer with both a memory array region and a periphery circuit region defined on the surface of the silicon substrate of the semiconductor wafer, with the memory array region comprising at least a cell-well, and the periphery circuit region comprising at least a N-well and a P-well;
   forming separately a plurality of MOS transistors in the memory array region and the periphery circuit region,
   forming a first dielectric layer in the memory array region;
   forming a plurality of landing pads in the dielectric layer in the memory array region;
   forming a stop layer on the surface of semiconductor wafer;
   forming a second dielectric layer on the surface of the stop layer;
   forming a first photoresist layer on the surface of the semiconductor layer;
   performing a first etching process to define a pattern of plurality of contact plugs in the first photoresist layer in both the memory array region and the periphery circuit region;
   using the pattern of the first photoresist layer as a hardmask to etch the second dielectric layer down to the surface of the stop layer so as to form a plurality of contact plug holes in the second dielectric layer;
   removing the stop layer at the bottom surface of each contact plug hole;
   forming a conductive layer on the surface of the semiconductor wafer and filling each contact plug hole; and
   performing a PEP process to form in-situ each contact plug in both the memory array region and the periphery circuit region, and to form a metal interconnection layer in the second dielectric layer.

12. The method of claim 11 wherein each MOS transistor is formed in both the memory array region and the periphery circuit region, the method comprises:
   forming a third dielectric layer, an undoped polysilicon layer, and a fourth dielectric layer, respectively, on the surface of the semiconductor wafer;
   performing a first ion implantation process on the undoped polysilicon layer in the memory array region so as to transform the undoped polysilicon layer in the memory array region to a doped polysilicon layer;
   performing a second etching process to completely remove the fourth dielectric layer in the memory array region and to etch a portion of the doped polysilicon layer;
   forming a silicide layer, a protection layer, and a second photoresist layer, respectively, on the surface of the semiconductor wafer;
   performing a second photolithographic process so as to define a pattern of a plurality of gates in the second photoresist layer in the memory array region;
   using the pattern of the second photoresist layer as a hardmask to etch the protection layer, the silicide layer, and the doped polysilicon layer located in the memory array region down to the surface of the third dielectric layer, as well as in-situ etching of the protection layer and the silicide layer located in the periphery circuit region down to the surface of the fourth dielectric layer;
   removing the second photoresist layer;
   performing a second ion implantation process to form a lightly doped drain (LDD) adjacent to each gate in the memory array region;
   removing the fourth dielectric layer in the periphery circuit region;
   forming a third photoresist layer on the surface of the semiconductor wafer;
   performing a third photolithographic process to define a pattern of a plurality of gates in the third photoresist layer above the N-well and P-well of the periphery circuit region;
   using the pattern of the third photoresist layer as a hard mask to etch the undoped polysilicon layer in the periphery circuit region down to the surface of the third dielectric layer so as to form each gate in the periphery circuit region;
   removing the third photoresist layer;
   performing a third ion implantation process to form a lightly doped drain (LDD) adjacent to each gate in the periphery circuit region;
   forming a silicon nitride layer on the surface of semiconductor wafer;
   etching the silicon nitride layer on the surface of region so as to form a spacer adjacent to each gate in the periphery region;
   performing a fourth and a fifth ion implantation process to form a source and drain adjacent to each gate above the P-well and N-well of the periphery circuit region.

13. The method of claim 12 wherein the second dielectric layer is composed of silicon dioxide ($SiO_2$) and serves as the gate oxide layer for each gate.

14. The method to claim 12 wherein the portion of the undoped polysilicon layer etched by the second etching process is approximately half the total depth of the undoped polysilicon layer.

15. The method of claim 12 wherein the protection layer is composed of Si i con nitride, and a silicon-oxy nitride ($SiO_xN_y$, where $0<x<2$ and $0<y<4/3$) layer serving as an anti-reflection coating (ARC) layer is positioned between the protection layer and the silicide layer.

16. The method of claim 12 wherein a silicon-oxy-nitride ($SiO_xN_y$, where $0<x<2$ and $0<y<4/3$) layer, serving as an anti-reflection coating (ARC) layer, is formed on the surface of the semiconductor wafer prior to the formation of the third photoresist layer on the surface of the semiconductor wafer.

17. The method of claim 16 wherein after the third photoresist layer is removed, the silicon-oxy-nitride ($SiO_xN_y$, where $0<x<2$ and $0<y<4/3$) layer located underneath the third photoresist layer is also removed.

18. The method of claim 12 wherein both the fourth and fifth ion implantation process are performed to dope the undoped poly-silicon layer of each gate above the P-well and N-well, respectively.

19. The method of claim 12 wherein after the formation of the source and the drain of each MOS transistor in the periphery circuit region, the method also comprises:

forming a metal layer on the surface of the semiconductor wafer, the metal layer covering the surfaces of each source, drain, and gate in the periphery circuit region;

performing a first rapid thermal process (RTP);

removing the portions of the metal layer that do not react with the surface of the semiconductor wafer; and performing a second rapid thermal process (RTP).

20. The method of claim 19 wherein the metal layer is composed of cobalt (Co), titanium(Ti), nickel(Ni), or molybdenum (Mo).

* * * * *